(12) United States Patent
Mitchell et al.

(10) Patent No.: US 10,697,910 B2
(45) Date of Patent: Jun. 30, 2020

(54) DETERMINING PROPERTIES OF POROUS MATERIAL BY NMR

(71) Applicant: SCHLUMBERGER TECHNOLOGY CORPORATION, Sugar Land, TX (US)

(72) Inventors: Jonathan Mitchell, Cambridge (GB); Edmund John Fordham, Cambridge (GB)

(73) Assignee: SCHLUMBERGER TECHNOLOGY CORPORATION, Sugar Land, TX (US)

(*) Notice: Subject to any disclaimer, the term of this patent is extended or adjusted under 35 U.S.C. 154(b) by 106 days.

(21) Appl. No.: 15/761,157

(22) PCT Filed: Sep. 14, 2016

(86) PCT No.: PCT/US2016/051566
§ 371 (c)(1),
(2) Date: Mar. 19, 2018

(87) PCT Pub. No.: WO2017/048737
PCT Pub. Date: Mar. 23, 2017

(65) Prior Publication Data
US 2018/0259466 A1    Sep. 13, 2018

(30) Foreign Application Priority Data

Sep. 18, 2015 (GB) .................... 1516562.4

(51) Int. Cl.
*G01N 24/08* (2006.01)
*G01N 15/08* (2006.01)
*G01R 33/30* (2006.01)

(52) U.S. Cl.
CPC .......... *G01N 24/081* (2013.01); *G01N 15/088* (2013.01); *G01R 33/307* (2013.01); *G01R 33/30* (2013.01)

(58) Field of Classification Search
None
See application file for complete search history.

(56) References Cited

U.S. PATENT DOCUMENTS

| 4,291,271 A | 9/1981 | Lauffer |
| 4,699,002 A | 10/1987 | Rockley |

(Continued)

FOREIGN PATENT DOCUMENTS

| GB | 2489005 A | 9/2012 |
| WO | 2014186154 A1 | 11/2014 |

OTHER PUBLICATIONS

Allen, D. F. et al., "The Practical Application of NMR Logging in Carbonates: 3 Case Studies", SPWLA-2001-K paper presented at the SPWLA 42nd Annual Logging Symposium held in Houston, Texas, USA, 2001, 14 pages.

(Continued)

*Primary Examiner* — Douglas X Rodriguez

(57) ABSTRACT

A porous material with liquid in the pores is examined by submerging the material in a bathing liquid, possibly a perfluorocarbon, which is immiscible with the liquid in the pores, is non-wetting towards the material, is immiscible with and differs in density from any liquid on the outside of the material, and does not contain a resonant element found in the bathing liquid. This bathing liquid displaces fluid from the surface of the porous material but not the liquid in the pores. Nuclear magnetic resonance signals from liquid in the pores give a measurement of pore volume. Volume of bathing liquid displaced by the porous material gives the bulk volume and porosity can be derived from these measurements. Sample preparation is minimal and a benchtop (Continued)

spectrometer can be used, making the method practical for examination of drill cuttings from a borehole while drilling.

20 Claims, 7 Drawing Sheets

(56) References Cited

U.S. PATENT DOCUMENTS

| | | | |
|---|---|---|---|
| 6,301,953 B1 | 10/2001 | Zamfes | |
| 6,453,727 B1 | 9/2002 | Lenormand et al. | |
| 6,486,212 B2 | 11/2002 | Meinert | |
| 6,661,000 B2 | 12/2003 | Smith et al. | |
| 6,715,347 B2 | 4/2004 | Zamfes | |
| 7,082,812 B2 | 8/2006 | Lenormand et al. | |
| 7,092,822 B2 | 8/2006 | Lenormand et al. | |
| 7,131,317 B2 | 11/2006 | Lenormand et al. | |
| 7,388,373 B2 | 6/2008 | Lenormand et al. | |
| 8,427,145 B2 | 4/2013 | Mitchell et al. | |
| 8,781,762 B2 | 7/2014 | MacLeod et al. | |
| 2006/0272812 A1 | 12/2006 | Yu et al. | |
| 2013/0301794 A1 | 11/2013 | Grader et al. | |
| 2013/0325348 A1 | 12/2013 | Valori et al. | |
| 2014/0002081 A1 | 1/2014 | Mitchell et al. | |
| 2014/0055134 A1 | 2/2014 | Fordham et al. | |
| 2014/0091800 A1* | 4/2014 | Fordham | G01R 33/305 324/321 |
| 2014/0184224 A1* | 7/2014 | Nevo | G01N 24/081 324/318 |
| 2014/0361466 A1 | 12/2014 | Kimour et al. | |

OTHER PUBLICATIONS

Borgia, G. C. et al, "Developments in core analysis by NMR measurements", Magnetic Resonance Imaging, 1996, 14(7-8), pp. 751-760.
Brownstein, K. R. et al., "Importance of classical diffusion in NMR studies of water in biological cells, " Physical Review A, 1979, 19, pp. 2446-2433.
Brownstein, S. et al., "Universal Referencing in Multinuclear Magnetic Resonance Spectroscopy", Journal of Magnetic Resonance, 1980, 38(1), pp. 131-133.
Carr, H. Y. et al., "Effects of Diffusion on Free Precession in Nuclear Magnetic Resonance Experiments", Physical Review, 1954, 94, pp. 630-638.
Coates, et al., "A New Characterization of Bulk-Volume Irreducible Using Magnetic Resonance", The Log Analyst, 1998, 39, pp. 51-67.
Davies, S. et al., "Pore size distributions from nuclear magnetic resonance spin-lattice relaxation measurements of fluid-saturated porous solids. II. Applications to reservoir core samples", Journal of Applied Physics, 1990, 67, pp. 3171-3176.
Egermann, P. et al., "A Fast and Direct Method of Permeability Measurements on Drill Cuttings", SPE 77563, presented at the SPE Annual Technical Conference and Exhibition held in San Antonio, Texas, USA, SPE Reservoir Evaluation & Engineering, 2002, 8(4), 7 pages.
Egermann, P. et al., "Petrophysical Measurements From Drill Cuttings as Added Value for the Reservoir Characterization Process", SPE 88684, presented at the 11th Abu Dhabi International Petroleum Exhibition and Conference held in Abu Dhabi, UAE, 2004, 8 pages.
Fens, T. W. et al., "Archie's dream: Petrophysics from Sidewall Samples and Cuttings", SCA conference paper No. 9805, 1998, 10 pages.
Fleury, M., "Characterizing porous structures using NMR relaxation measurements", Revue de l'Institut Francais du petrole, 1998, 53, pp. 489-493.
Haacke, E. M. et al., "Magnetic Resonance Imaging—Physical Principles and Sequence Design", John Wiley & Sons, Inc., New York, 1999, Chapter 10.2, 58 pages.

Harris, R. K. , Appendix 1 "NMR properties of the spin-1/2 nuclei" and Appendix 2, "The spin properties of quadrupolar nuclei", in Nuclear Magnetic Resonance Spectroscopy, (1983) Longman Scientific & Technical (reprint, 1986), Hong Kong, Appendices 1 & 2, pp. 236-239.
Hurlimann, M. D. et al., "Quantitative measurement of two-dimensional distribution functions of diffusion and relaxation grossly inhomogeneous fields", Journal of Magnetic Resonance, 2002, 157(1), pp. 31-42.
Hurlimann, M. D. et al., "The diffusion-spin relaxation time distribution function as an experimental probe to characterize fluid mixtures in porous media", Journal of Chemical Physics, 2002, 117(22), pp. 10223-10232.
Jones Jr., W. R. et al., "The Preparation of New Perfluoroether Fluids Exhibitng Excellent Thermal-Oxidative Stabilities", NASA Technical Memorandum 87284, 1986, 20 pages.
Kenyon, W. E., "Petrophysical Principles of Applications of NMR Logging", The Log Analyst, 1997, 38(2), pp. 21-43.
Kenyon, W. E., et al, "A Three-Part Study of NMR Longitudinal Relaxation Properties of Water-Saturated Sandstones", SPE 15643, SPE Formation Evaluation, 1988, 3(3), pp. 622-636.
Kleinberg, R. L. et al., "NMR properties of reservoir fluids", The Log Analyst, 1996, 37(6), pp. 20-32.
Lenormand, R. et al., "Advances in Measuring Porosity and Permeability from Drill Cuttings", SPE-111286, presented at the SPE/ EAGE Reservoir Characterization and Simulation Conference held in Abu Dhabi, UAE, 2007, 9 pages.
Looyestijn, W. J. "Wettability index determination from NMR logs", Petrophysics, 2008, 49(2), pp. 130-145.
Looyestijn, W. J. et al., "Wettability-index determination from NMR logs", SPE 93624, SPE Reservoir Evaluation & Engineering, 2006, 9(2), pp. 146-153.
Meazza, O. et al., "Porosity From Cuttings: Options and Answers", SCA conference paper No. 9606, 1996, 14 pages.
Meiboom, S. et al., "Modified Spin-Echo Method for Measuring Nuclear Relaxation Times", Review of Scientific Instruments, 1958, 29(8), pp. 688-691.
Mirotchnik, K. et al., "A Novel Method to Determine NMR Petrophysical Parameters from Drill Cuttings", paper presented at the SPWLA 45th Annual Logging Symposium held in Noordwijk, The Netherlands, 2004, 15 pages.
Mitchell, J. et al., "Contributed Review: Nuclear magnetic resonance core analysis at 0.3 T", Review of Scientific Instruments, 2014, 85, pp. 111502: 12 pages.
Mitchell, J. et al., "Digital filtering", (pp. 10-14) Subsection 3.3 in "Low-field permanent magnets for industrial process and quality control", Progress in Nuclear Magnetic Resonance Spectroscopy, 2014, 6, pp. 1-60.
Moskau, D., "Application of Real Time Digital Filters in NMR Spectroscopy", Concepts in Magnetic Resonance, 2001, 15(2), pp. 164-176.
Nes, O. M. et al., Rig Site and Laboratory Use of CWT Acoustic Velocity Measurements on Cuttings, SPE 50982, presented at the SPE European Petrleum Conference held in Milan, Italy, 1996, SPE Reservoir Evaluation & Engineering, 1998, 1(4), 6 pages.
Price, W. S., "Pulsed-Field Gradient Nuclear Magnetic Resonance as a Tool for Studying Translational Diffusion: Part II. Experimental Aspects", Concepts in Magnetic Resonance Part A, 1998, 10(4), pp. 197-237.
Santarelli, F. J. et al., "Formation Evaluation from Logging on Cuttings", SPE-36851, SPE Reservoir Evaluation & Engineering, 1998, 1(3) pp. 238-244.
Seevers, D. O., "A Nuclear Magnetic Method for Determining the Permeability of Sandstones", SPWLA-1966-L paper presented at the SPWLA 7th Annual Logging Symposium held in Tulsa Oklahoma, USA, 1966, 14 pages.
Siddiqui, S. et al., "Techniques for extracting reliable density and porosity data from cuttings", SPE-96918, presented at the SPE Annual Technical Conference and Exhibition held in Dallas, Texas, USA, 2005, 13 pages.
Stejskal, E. O. et al., "Spin-Diffusion Measurements: Spin Echoes in the Presence of a Time-Dependent Field Gradient", Journal of Chemical Physics, 1965, 42, pp. 288-292.

(56) References Cited

OTHER PUBLICATIONS

Straley, C. et al., "NMR in Partially Saturated rocks: laboratory insights on free fluid index and comparison with borehole logs", The Log Analyst, 1995, pp. 40-56.

Straley, C., et al., "Core Analysis by Low Field NMR", SCA Conference Paper 04, 1994, pp. 43-56.

Tanner, J. E., "Use of the Stimulated Echo in NMR Diffusion Studies", Journal of Chemical Physics, 1970, 52(5), pp. 2523-2526.

Tien, C. et al., "Influence of pore size on the Knight shift in liquid tin and mercury in a confined geometry", Journal of Physics: Condensed Matter, 2007, 19(10), pp. 106217 (8 pages).

Timur, A., "Effective Porosity and Permeability of Sandstones Investigated Through Nuclear Magnetic Resonance Principles", SPWLA-1968-K, presented at the SPWLA 9th Annual Logging Symposium held in New Orleans, Louisiana, USA, 1968, 18 pages.

Timur, A., "Pulse Nuclear Magnetic Resonace Studies of Porosity, Moveable Fluid, and Permeability of Sandstones", Journal of Petroleum Technology, 1969, 21, pp. 775-786.

Varanda, F. R. et al., "Liquid-liquid equilibrium of substituted perfluoro-n-octane+n-octane systems", Fluid Phase Equilibria, 2008, 268, pp. 85-89.

Worthington, A. E. et al., "Reservoir Petrophysics of Poorly Consolidated Rocks I. Well-Site Procedures and Laboratory Methods", SPWLA-1987-BB, presented at the SPWLA 28th Annual Logging Symposium, London, England, 1987, 17 pages.

Combined Search and Examination Reports Under Sections 17 and 18(3) of GB Patent Application No. 1516562.4, dated Feb. 24, 2016, 5 pages.

International Preliminary Report on Patentability of International Patent Application No. PCT/US2016/051566, dated Mar. 29, 2018, 7 pages.

\* cited by examiner

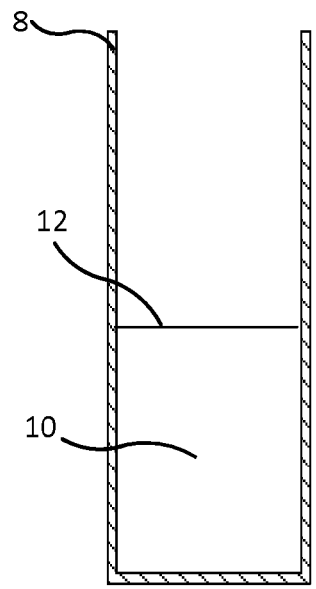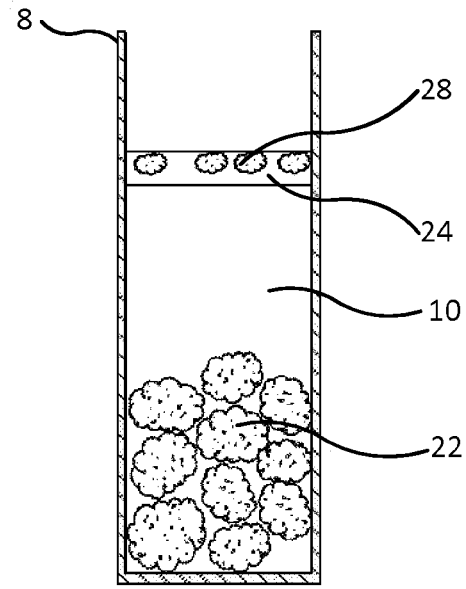
Fig 3     Fig 4
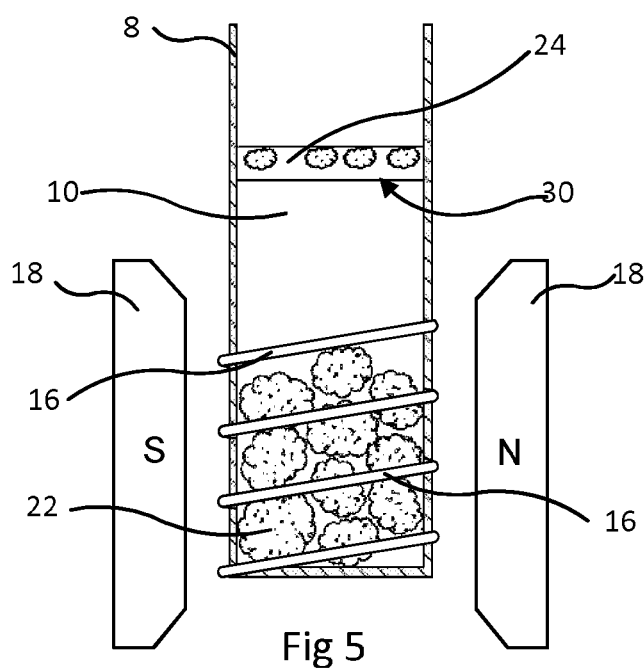
Fig 5

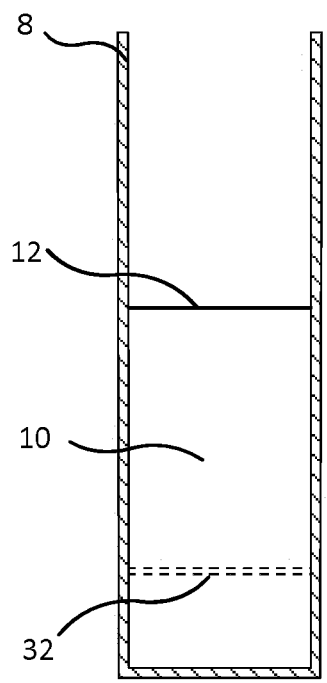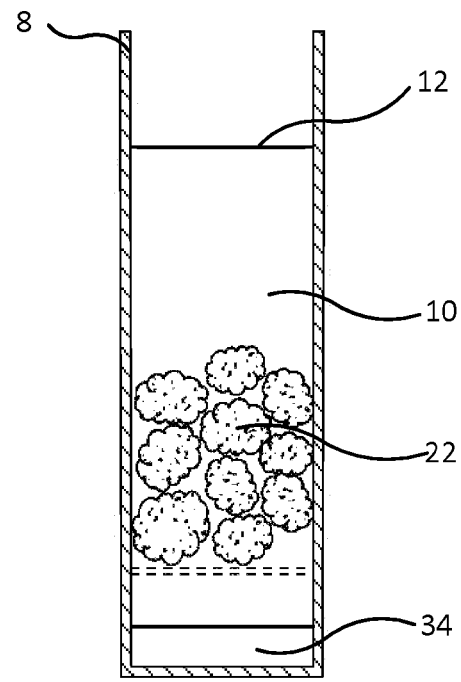
Fig 6  Fig 7
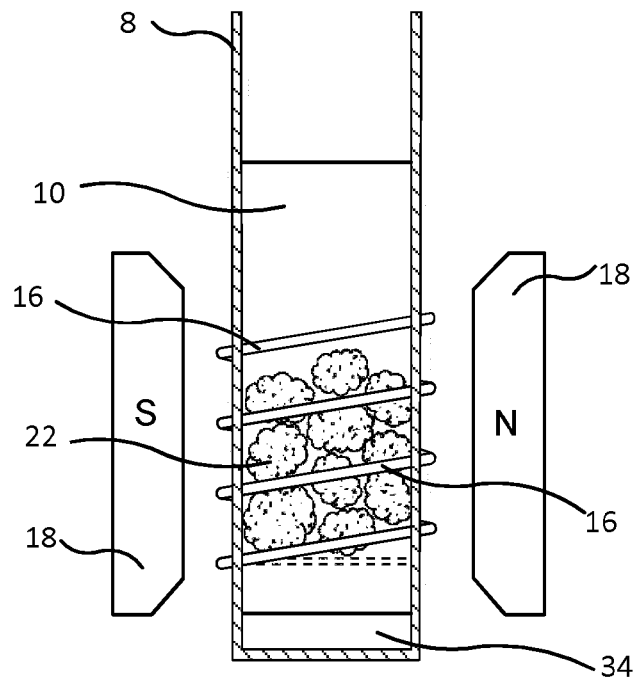
Fig 8

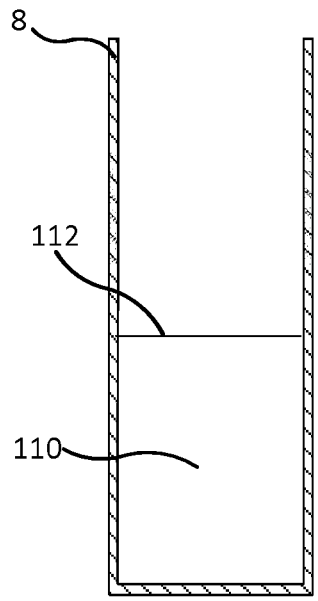
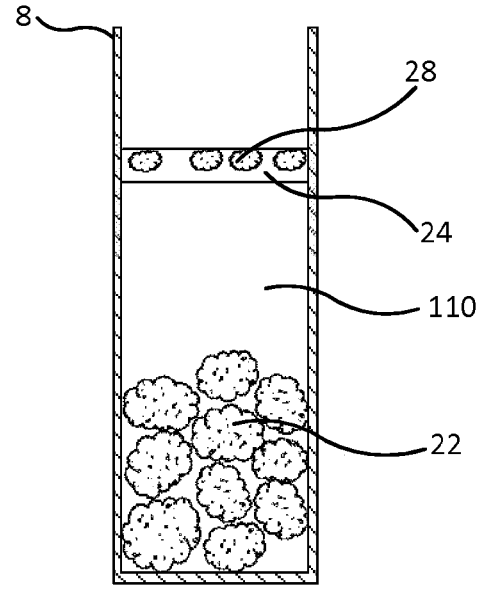
Fig 11   Fig 12
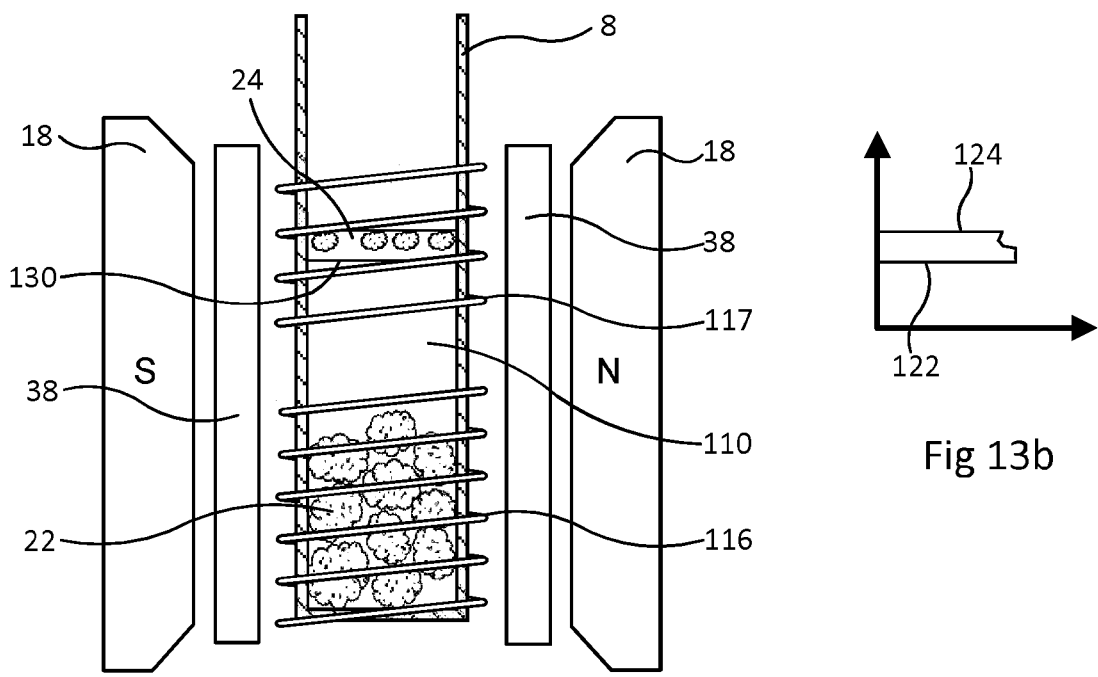
Fig 13a   Fig 13b

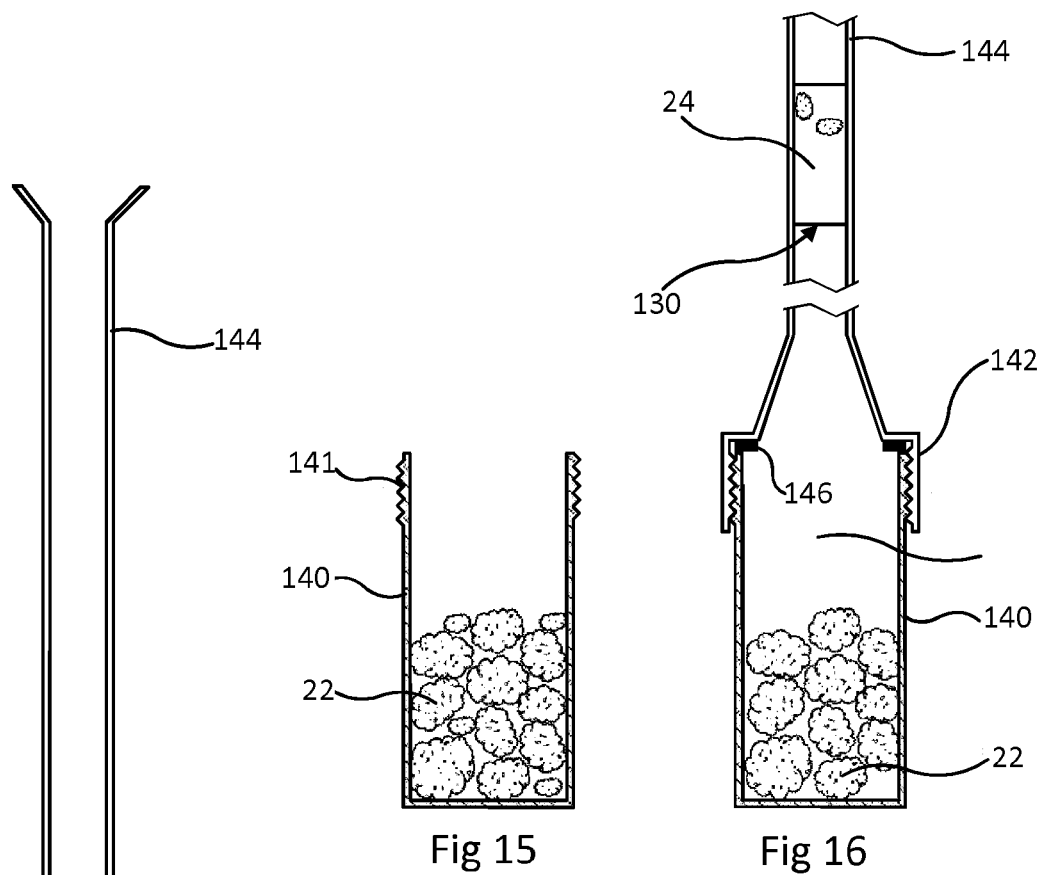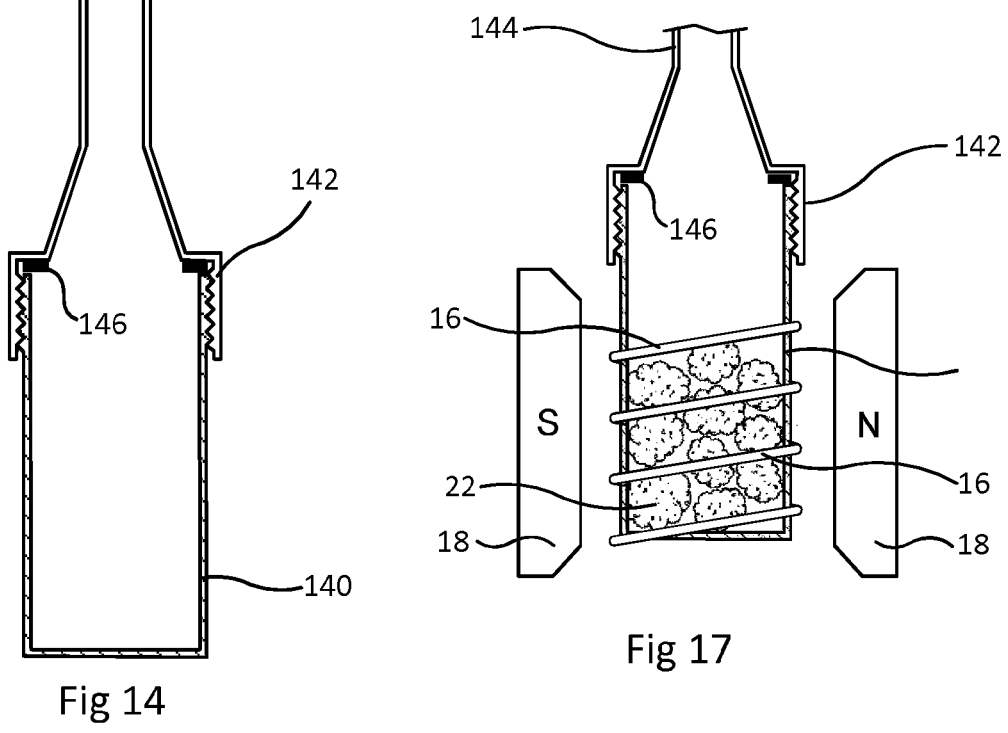

DETERMINING PROPERTIES OF POROUS MATERIAL BY NMR

CROSS-REFERENCE TO RELATED APPLICATION

The present document is based on and claims priority to GB Application Serial No.: 1516562.4, filed Sep. 18, 2015, which is incorporated herein by reference in its entirety.

FIELD AND BACKGROUND

The present disclosure is concerned with determining porosity and/or other properties of porous material with liquid in the pores of the material. Porous material to be examined may be encountered in a number of industries and circumstances. Possibilities include examination of samples of particulate catalysts, chromatography column packing materials, porous pharmaceutical materials as well as many other porous materials which may be in the form of particles or larger objects. A number of physical properties of porous material may be of interest, again depending on industry and circumstances. Some are properties of liquid in the pores, others are characteristics of the porous material, including its porosity which can be expressed as the volume of the pores as a percentage of the bulk volume of the material.

An area of interest to the present applicants is the examination of drill cuttings brought to the surface during the drilling of a subterranean borehole. When drilling a subterranean borehole with a rotary drill, as is done when drilling for oil or gas, it is standard practice to pump drilling fluid from the surface, down the drill string within the borehole to the drill bit and then back to the surface entraining the cuttings made by the drill bit. Drill cuttings are then separated from the drilling fluid at the surface.

There are numerous techniques for investigating the nature and properties of underground strata before, during and after drilling. Examination of drill cuttings is one of this range of techniques.

When drilling for oil or gas, examination of drill cuttings is used in the course of so called mud logging carried out at the well site, that is logging data from drilling fluid returning to the surface to build a geological description of the reservoir, determine hydrocarbon indices, and identify zones from which oil or gas can be produced.

Nuclear magnetic resonance (NMR) has become a recognized tool in the field of petrophysics, both as a laboratory tool and as a downhole well logging tool. The signal amplitude obtained in an NMR measurement is directly proportional to the number of resonant nuclei (usually $^1H$) in a sample which is being examined, and therefore the signal amplitude is directly proportional to the mass of oil or brine present in a sample.

Although NMR can observe liquids within cuttings, NMR measurements are also sensitive to liquids surrounding the exterior of cuttings, which will include interstitial liquid trapped between the cuttings which are packed together. This liquid at the exterior of cuttings can provide a significant or dominant contribution to the observed signal. Thus it can be impractical or even impossible to use NMR to examine properties of fluid within pores because signals from a resonant nucleus within the pores are inseparable from much stronger signals coming from the same resonant nucleus present in fluid at the exterior of the porous material. Although there have been a few proposals to make use of NMR at a well-site, these have tended to envisage time-consuming cleaning of the cuttings' exterior as a preliminary step which may prove to be impractical to implement at the well site for significant sample volumes. Thus, the majority of studies published on petrophysics from drill cuttings have relied on data generated in laboratories away from the well site.

In summary, obtaining information rapidly at the well site as drilling is in progress is desirable, because the information is then available in near real time as an input to decisions about the drilling. However, there are a number of properties, relevant as petrophysical information, which can be determined through off-site laboratory analysis of drill cuttings but which are rarely if ever determined on cuttings at the well site due to the complexity of the methodology or the size and cost of equipment required. More specifically porosity of the rock from which the cuttings have been drilled is a significant property which is not normally determined at the well site. Others which normally are only available through off-site analysis are permeability, irreducible water saturation and wettability.

SUMMARY

This summary is provided to introduce a selection of concepts that are further described below. This summary is not intended to be used as an aid in limiting the scope of the subject matter claimed.

Broadly, embodiments of the present invention provide a method of using nuclear magnetic resonance (NMR) to examine a porous material, the pores of which contain fluid in which there is an element with a resonant nucleus. The method comprises submerging the material in a quantity of liquid, referred to here as the bathing liquid, which has properties such that it does not displace the fluid in the pores, is immiscible with and differs in density from any fluid on the outside of the material, and does not contain the said element with the resonant nucleus, and operating a nuclear magnetic resonance spectrometer to observe signals from nuclei of the said element with the resonant nucleus while the material remains submerged in the bathing liquid.

Suitable properties for the bathing liquid, such that it will not displace liquid from the pores, are that it is immiscible with the liquid in the pores and is non-wetting towards the porous material in the presence of the liquid which is in the pores.

The method can be applied to porous material which is in the form of particles, so that when the NMR spectrometer is operated to observe signals, there are a plurality of particles of material within the radio-frequency and magnetic fields of the spectrometer. These particles may differ from one another in shape and size. A further possibility is that the material is a single piece or a small number of pieces of material. It is also possible that the material is in the form of one or more pieces which are each composed of particles compacted together.

Submerging wet material in a bathing liquid with properties stated above provides a way to displace liquid containing the resonant nucleus from the exterior of the material without losing fluid which is in the pores of the material, and hence to isolate the resonance signals from fluid within the pores. Because fluid on the exterior of the material differs in density from the density of the bathing liquid, when the material is submerged in the bathing liquid the fluid (if any) on the exterior of the material will detach and float to the surface of the bathing liquid or sink to the bottom. Because any fluid which was previously on the exterior of the material has become spatially separated from the material, it is possible to obtain NMR signals from the fluid within the pores without simultaneously receiving inseparable signals from fluid that is not in the pores.

This makes it possible to determine the pore volume. The amplitude of magnetic resonance signals from the liquid within the pores of the porous material is proportional to the volume of that liquid and therefore also proportional to the volume of the pores containing that liquid. With calibration to determine the ratio of signal amplitude to volume, this provides a measure of the volume in the pores of the material.

Some forms of the method disclosed here include determining the volume of bathing liquid displaced by the porous material. This gives a measurement of the bulk volume of the porous material, where bulk volume is the volume of solid content plus pore volume of the material. Determination of bulk volume by displacement of liquid is useful when the material is in the form of particles of varying shape and size. It is also useful if the material is in the form of one or more pieces which do not have a simple geometrical shape but instead have irregularities in shape so that their bulk volume cannot easily be calculated from measurable dimensions. Moreover, even if bulk volume could be calculated from measurements, it may be more convenient to determine bulk volume by displacement.

Once the bulk volume and pore volume are known, the porosity can readily be calculated as $$\text{porosity} = \frac{\text{pore volume}}{\text{bulk volume}} \times 100\%$$

The method may be applied to discrete samples of porous material, so as to determine pore volume and bulk volume of the porous material in each sample. However, it is also possible that measurements could be made repeatedly and average values used to obtain an average value of porosity. Such averaging could be used when examining material carried as a stream through the radio frequency and magnetic fields of an NMR spectrometer.

Determining the volume of bathing liquid displaced by the porous material can be done in several ways. One possibility is to observe the change in volume by visual inspection. The sample holder which contains a sample of drill cuttings and bathing liquid may be marked with graduations to indicate the volume within it, in the same manner as a laboratory measuring cylinder.

Another possibility is to use NMR to observe the position of the upper surface of the bathing liquid before and after a sample of porous material is submerged in it. The volume displaced can then be calculated from the geometry of the sample container and the distance by which the upper surface has risen. If the sample holder has uniform internal horizontal cross section, the volume displaced is simply the area of the horizontal cross section multiplied by the distance by which the upper surface has risen. It will be appreciated that after a sample is submerged, and any liquid from the exterior of the material has floated to the top, the upper surface of the bathing liquid may be an interface between bathing liquid and less dense liquid displaced from the exterior of material.

In some forms of the method disclosed here, the bathing liquid contains a second element with a resonant nucleus. This makes it possible to observe a change in NMR signal from the bathing liquid when the porous material is submerged in the bathing liquid and thereby obtain a measurement of the volume of bathing liquid displaced by the material which is of course a measurement of the bulk volume of the material. Bulk volume is the overall volume of the porous material including its pore volume. This change in NMR signal from the bathing liquid may be a change in signal amplitude.

Such forms of the method can be stated as a method of using nuclear magnetic resonance (NMR) to examine properties of a porous material with fluid which contains a first element with a resonant nucleus present in the pores, the method comprising:

submerging the material in a quantity of a bathing liquid which is immiscible with the fluid in the pores and is non-wetting to the material so that it does not enter the pores of the material, differs in density from and is immiscible with any fluid containing the first element on the outside of the material, does not itself contain the first element but does contain a second element with a resonant nucleus;

operating a nuclear magnetic resonance spectrometer to observe resonance signals from nuclei of the first element present in the fluid in the pores but absent from the bathing liquid and determine one or more magnetic resonance properties of the fluid in the pores; operating the same or another nuclear magnetic resonance spectrometer to measure change in resonance signal from nuclei of the second element in the bathing liquid when the material is submerged in it, indicative of the volume of bathing liquid displaced by the material submerged within it; and using the measurements indicative of the volume displaced by the submerged material and the measurements of magnetic resonance properties of the fluid in the pores to determine porosity of the material and optionally other properties of the fluid in the pores.

As mentioned previously, this method may be applied to discrete samples of porous material, so as to determine pore volume and bulk volume of the material in each sample. However, it is also possible that repeated measurements could be averaged and used to obtain an average value of porosity.

The second element with a resonant nucleus may be an element which is absent both from the porous material and from the fluid in the pores of that material. However, it is possible that use of NMR for observing the volume of bathing liquid displaced by the material could differentiate between signals from the second element within the bathing liquid and signals from the same element when present in pores of the material.

One possibility is to use a perfluorocarbon as the bathing liquid and then use hydrogen and fluorine as the first as second elements, thus using $^1H$ NMR to examine the fluid in the pores while using $^{19}F$ NMR to observe displacement of bathing liquid when the sample is added. However, other combinations of elements with resonant nuclei are possible.

Observation of resonant nuclei could possibly be carried out using two separate NMR spectrometers but more conveniently may carried out using a single nuclear magnetic resonance spectrometer with ability to make separate measurements of resonance signals from the first and second resonant nuclei.

The method disclosed here provides a way to overcome inherent difficulties in bringing the advantages of NMR to the examination of porous material. As already mentioned, NMR has the ability to observe signals from the resonant nucleus in liquid in the pores of the material but its application can be frustrated by the need to distinguish from any signals coming from the same resonant nucleus in liquid outside the pores.

Relaxation times for NMR signals are affected by the surrounding physical and chemical environment and there have been proposals to use difference in relaxation times as a distinction between resonant nuclei within pores and the same resonant nuclei outside pores. The present inventors find that relaxation times do not always give clear distinction, especially when the unwanted signals from outside the pores may be much stronger than the desired signals from within the pores.

There have also been proposals to remove liquid from the exterior of porous material by contacting the porous material with something able to absorb liquid from the exterior surface. However, in the course of such sample preparation, an unknown amount of liquid from within the pores may also drain out and be removed.

The method disclosed now avoids both of these pitfalls by using the bathing liquid to displace other, unwanted, liquid from the exterior of porous material while the non-wetting and immiscible characteristics of the bathing liquid prevent it from entering the pores and thus protect liquid which is already within the pores of the material.

Some forms of the method now disclosed do obtain NMR signals both from liquid remaining within the pores and from the bathing liquid surrounding the porous material. However, this is done using different resonant nuclei. It can easily be arranged that resonant frequencies of two different nuclei will be sufficiently far apart that their bandwidths do not overlap and so the signals from the different nuclei can be unambiguously distinguished.

BRIEF DESCRIPTION OF DRAWINGS

FIGS. 3 to 5 diagrammatically illustrate stages in an embodiment of the disclosed method;

FIGS. 6 to 8 diagrammatically illustrate stages in an embodiment with dense drilling fluid;

FIGS. 11, 12, 13a, and 13b diagrammatically illustrate stages in an embodiment using one resonant nucleus;

FIG. 14 shows a graduated sample holder;

FIGS. 15 to 17 diagrammatically show an embodiment using the sample holder of FIG. 14, and FIG. 18 schematically shows an arrangement for continuous sampling.

DETAILED DESCRIPTION

Figure 1:
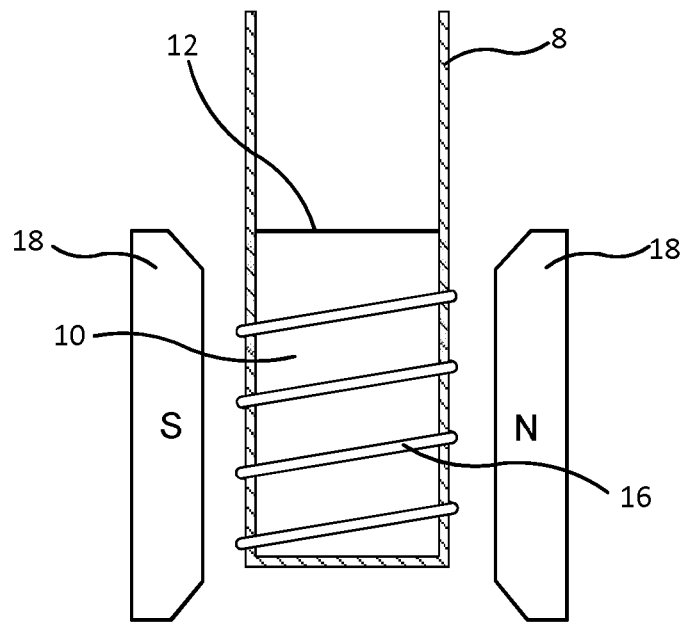
FIGS. 1 and 2 diagrammatically illustrate a preliminary calibration.

This detailed description of embodiments is given as exemplification, not limitation. Largely it refers to embodiments in which there is examination of drill cuttings collected from drilling fluid circulated down and then back up a borehole which is being drilled. This is one application of the disclosed method but there are many others, as will be mentioned.

Some drilling fluids are water-based which means that the fluid is an aqueous saline solution and may containing a viscosity increasing material. Some drilling fluids are oil-based and these may include oil-soluble surfactants and other constituents as well as oil. Drilling fluids may contain suspended solids of small particle size. Separation of drill cuttings from drilling fluid is well known in the field of oil drilling and will not be described here. The cuttings are rock fragments and these may be porous, especially when the borehole penetrates oil-containing strata. Separated cuttings will have liquid within the pores. When drilling through porous rock it is normal that some of the liquid phase of the drilling fluid (referred to as filtrate of that fluid) enters the pores. Consequently, the liquid in the pores of drill cuttings may be subterranean brine, oil, the liquid phase of drilling fluid which has entered the pores or some combination of these. The cuttings will normally also have some liquid on their exterior and this may include liquid held at interstices between drill cuttings packed together. Liquid on the exterior of cuttings may be drilling fluid, subterranean brine or crude oil or some combination of these.

It is desirable that separated cuttings are kept in a wet state to avoid drainage of the liquid from the pores. The sample which is used may take the form of a number of cuttings with wet exterior surfaces, or may be a number of cuttings partially or fully submerged in liquid.

The cuttings may be selected by size. This selection may exclude small cuttings such as those with dimensions not exceeding 0.5 mm because these may have microfractures formed during drilling so that their apparent porosity is not representative of the geological formation from which they have come. Selection may also avoid exceptionally large pieces of material because these are suspected to have detached from the borehole wall at some point above the drill bit and so not be representative of the formation which is currently being cut by the drill bit.

The presently disclosed method utilizes a liquid in which a sample of porous material (drill cuttings in many embodiments) is submerged, so that this liquid is conveniently referred to as bathing liquid. This bathing liquid is chosen, in relation to the liquid in the pores of the material so that it is immiscible with the liquid in the pores and is and in the presence of the pore liquid is non-wetting towards the material so that it does not wet the walls of the pores in the presence of the liquid which is already present in the pores. With these characteristics it does not enter the pores by capillary imbibition and neither dilutes nor displaces the fluid in those pores.

This bathing liquid should also be immiscible with the liquid (if any) at the exterior of the porous material and have different density. The consequence of this is that liquid which is carried on the exterior of the submerged porous material detaches from it and floats to the surface of the bathing liquid or, if it is dense enough, settles to the bottom of the bathing liquid. The speed with which any liquid at the exterior of the porous material detaches from it may be enhanced by shaking the bathing liquid when the material has been submerged in it.

Non-wetting behavior, as required here, depends on properties of the bathing liquid, properties of the liquid already in the pores, and properties of the solid part of the porous material. As is well known, wetting of a surface occurs when the contact angle between a liquid and a surface is less than 90 degrees. When two immiscible liquids are in contact with a solid surface, one may wet the surface while the second does not, but the contact angle for each fluid will not be the same as its contact angle in the absence of the other fluid.

If a drilling fluid is water based and the rock formation from which drill cuttings have come is strongly wet by water, the liquid in the pores of the cuttings will be aqueous. A hydrophobic liquid may then serve as a bathing liquid which is immiscible with the liquid in the pores and non-wetting towards the rock from which the cuttings are formed. Conversely, if a drilling fluid is oil based, the rock is oil-wet and the liquid in the pores is oil from the drilling fluid, a hydrophilic bathing liquid may be immiscible with the oil and non-wetting towards the rock.

However, many types of rock are capable of being wet by both oil and water. When examining drill cuttings from a succession of rock strata as a borehole is drilled, it may be helpful, for the sake of a more robust procedure, to use a bathing liquid which is not miscible with either oil or water and is non-wetting toward a range of rock types under both oil-wet and water-wet conditions.

One liquid which has such characteristics and could possibly be used is mercury. Other liquids which are immiscible with both oil and water and are non-wetting towards a range of rock types are liquid perfluorocarbons, that is to say chemical compounds having a molecular structure formed of carbon atoms and possibly some other atoms such as oxygen or nitrogen with all hydrogen atoms replaced by fluorine atoms so that the molecule consists of carbon, fluorine and possibly some other atoms, but without hydrogen. Carbon-fluorine bonds have high bond strength and fluorine has low polarizability, so that perfluorocarbons display strong intra-molecular bonding and weak intermolecular interaction. As a result they are immiscible with water, aqueous solutions and a range of hydrocarbon oils. They also tend to be chemically inert and non-wetting towards many types of non-metallic material. Perfluorocarbon compounds generally have high density, so that most aqueous or hydrocarbon reservoir liquids will float on top of them.

There are a number of possibilities and suppliers. One possibility is liquids containing only carbon and fluorine atoms. These may be analogues of saturated aliphatic hydrocarbons in which all hydrogen atoms are replaced by fluorine. Such compounds may contain at least eight carbon atoms and may have straight or branched chains. Suppliers of such compounds include F2Chemicals Limited, Preston, UK.

Similar properties of immiscibility with both water and oil have been reported for compounds in which a structure of carbon atoms bears fluorine atoms and includes a smaller number of other covalently bonded atoms. One instance of such perfluorocarbons is a range of liquids sold by the 3M company under their trademark "FLUORINERT". FLUORINERT FC-40 is a mixture of perfluorinated trialkylamines in which the predominant compound has been stated to be perfluorotributylamine having the formula $$N(CF_2CF_2CF_2CF_3)_3$$

FLUORINERT FC-40 has a density of 1.85 g cm$^{-3}$. Another liquid in this range is FLUORINERT FC-72 which is predominantly perfluorotripentylamine.

Perfluorocarbons may contain oxygen atoms. Perfluoropolyethers are a class of compounds which may be immiscible with water and a variety of oils. Compounds in this category may be polymers of hexafluoropropylene oxide, having the structure

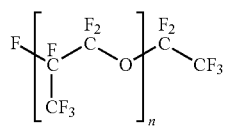

Liquids with this structure where n is 10 or more are available from DuPont under their trademark "KRYTOX". Perfluoropolyethers are also available from Solvay under their trademark "GALDEN".

Monomeric perfluorocompounds containing ether oxygen atoms, where the numbers of carbon and fluorine atoms is considerably more than the number of oxygen atoms are disclosed by Jones et al in NASA Technical Memorandum 87284.

So, in a number of embodiments of the present method, the bathing liquid may be a compound or mixture of compounds which comply with a general formula $$C_aF_bX_c$$

where X denotes an atom other than carbon or fluorine which is covalently attached to at least one carbon atom, where the number of carbon atoms (a in the formula) is at least 6, and the number of fluorine atoms (b in the formula) is at least 6 times the number of X atoms (c in the formula). The number of carbon atoms may be at least 8 or 10.

Some embodiments of the method utilize bathing liquid which is immiscible with oil and aqueous solutions, but do not require the bathing liquid to be free of hydrogen. Such embodiments may use a fluorocarbon in which some hydrogen is present, such as 1H perfluorooctane and 1H, 8H perfluorooctane mentioned by Varanda et al in Fluid Phase Equilibria vol 268 pages 85-898 (2008) and which are commercially available. Another example is compounds of the forms $$F(CF_2)_n(CH_2)_mH \text{ and } F(CF_2)_n(CH_2)_m(CF_2)_nF$$

which are described in U.S. Pat. No. 6,486,212. A similar compound, 2H,3H perfluoropentane, is available from DuPont. For use in the present method the proportion of fluorine atoms in a molecule may be considerably greater than the proportion of hydrogen atoms (for instance at least three or at least four times as many fluorine as hydrogen atoms).

If the method is applied to the examination of a porous material other than drill cuttings, the qualitative nature of the material may be constant and known. In such a case there may be a wider choice for the bathing liquid.

The present method uses NMR to observe at least one element which displays magnetic resonance and is present in the liquid in the pores of drill cuttings. As is well known, a number of elements have nuclei which exhibit magnetic resonance. One which is present in fluids from a borehole is hydrogen which is of course present in both oil and aqueous solutions.

Embodiments of the method disclosed herein may be carried out using an NMR spectrometer in which the magnetic field is provided by permanent magnets. A magnetic field of the strength provided by permanent magnets is sometimes referred to as a "low field" or "intermediate field" but there is some inconsistency in the use of these terms. An NMR spectrometer having field provided by permanent magnets may be a so called "bench top" machine which is small enough to me movable from one place to another when required. Manufacturers of such machines include Magritek with places of business in San Diego, Calif., USA and Wellington, New Zealand and Oxford Instruments, Abingdon, UK.

In the field of NMR spectrometry it is common to refer to the magnetic field strength in a spectrometer by stating the frequency of proton resonance in the magnetic field. An NMR spectrometer to be used in the method disclosed here may have a magnetic field of such strength that the proton resonance is in a range from 1 to 10 MHz, although possibly in a wider range up to 60 MHz or 100 MHz.

Such an NMR spectrometer may be constructed to accommodate a sample holder which is a flat bottomed tube with an internal diameter in a range from 15 to 50 mm and possibly in a range from 15 to 25 mm.

Example 1

A first embodiment of the method will now be described with reference to FIGS. 1 to 5. This utilizes a tube 8 which is a sample holder for a bench top NMR spectrometer which is constructed as a portable benchtop machine rather than as a permanent installation. The tube 8 has uniform interior and exterior diameters and has a flat base. This tube 8 may be made of glass or a ceramic material so that it does not contain any significant amount of the elements hydrogen and fluorine. Some steps of this method are carried out with the NMR spectrometer operating to observe $^{19}$F resonance and some are carried out with the NMR spectrometer operating to observe $^{1}$H resonance.

In a preliminary calibration procedure, a quantity of FLUORINERT FC-40 indicated as 10 with its surface at 12 is placed in the tube 8. Then as shown by FIG. 1 the tube is placed inside the radio-frequency (RF) coil 16 and magnetic field of the benchtop NMR spectrometer which has its magnetic field provided by permanent magnets 18. This spectrometer is operated to measure the amplitude of $^{19}$F resonance from the liquid 10.

Figure 2:
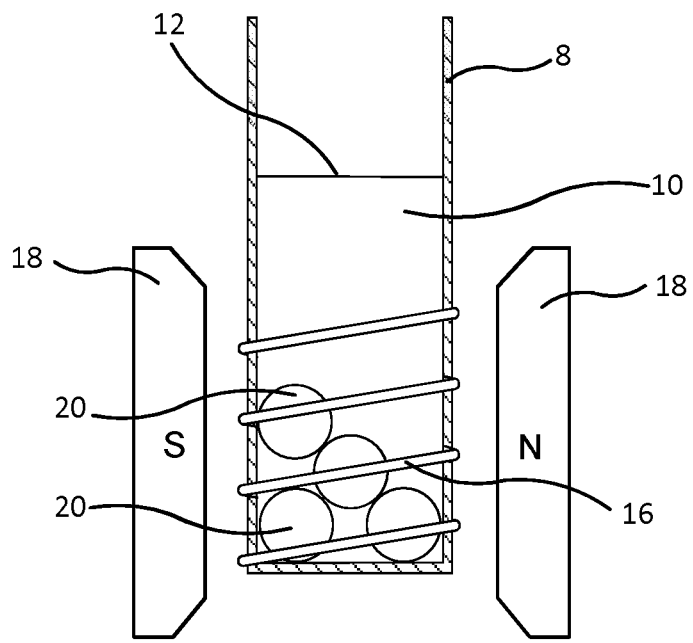

As shown by FIG. 2, solid objects of known volume, which may for example be glass spheres where the weight and density of the glass is known, are added to the liquid 10 in the tube. These objects 20 displace liquid 10. The spectrometer is again operated to measure the amplitude of $^{19}$F resonance from the liquid 10. This may be repeated with further objects 20 added to the tube 8. The measurements of signal amplitude are plotted against volume of fluid displaced by the objects 20, thereby determining the relationship (which should be linear proportionality) between the amplitude of the $^{19}$F resonance signal and the volume of liquid 10 displaced from the portion of the sample tube 8 which lies within the magnetic and RF fields of the NMR spectrometer.

A directly similar calibration experiment is carried out using aqueous brine in the tube 8 and measuring the amplitude of $^{1}$H resonance as objects 20 are used to displace some of the brine.

The next stage is to determine the bulk volume of a sample of drill cuttings 22. These are cuttings which have been collected from drilling fluid returning to the surface and have been kept submerged in some of the drilling fluid after collection. These cuttings 22 contain subterranean oil and/or brine and/or drilling fluid in their pores and have some drilling fluid on their exterior. As shown by FIG. 3, a quantity of FLUORINERT FC-40 indicated as 10 with its surface at 12 is placed in the tube 8 and then a sample quantity of these cuttings 22 is added to the tube 8. The liquid 10 provides a bath of liquid in which the sample cuttings 22 are submerged and the liquid 10 is therefore referred to as "bathing liquid". The tube 8 containing the liquid 10 and the submerged sample cuttings 22 is gently agitated. As shown by FIG. 4, any drilling fluid carried into the tube 8 on the exterior of the cuttings 22 detaches and floats to the top of the liquid 10 along with some very small solid particles 28 which are buoyant because of microfractures in them. The tube 8 is next placed within the magnetic field and radio-frequency (RF) coil 16 of the NMR spectrometer as diagrammatically shown by FIG. 5. The size of the sample quantity of the cuttings 22 was chosen so that the cuttings now occupy a substantial portion of the space within the RF coil 16 but not to extend outside the RF coil. The volume of liquid 10 is large enough that its interface 30 with displaced drilling fluid 24 is outside the radio-frequency coil 16 of the spectrometer. The NMR spectrometer is now operated to measure the amplitude of the $^{19}$F resonance signal from the liquid 10. Using the relationship determined in the calibration procedure, this gives the volume of liquid 10 displaced by the sample of cuttings 22, and this is the bulk volume of the sample of cuttings 22.

Next, the NMR spectrometer is operated to examine the fluid in the pores of the drill cuttings 22 by $^{1}$H NMR. This is possible, because, as shown by FIG. 5, any drilling fluid displaced from the cuttings is floating above the RF coil 16 and is not observed by the spectrometer. The total amplitude of the $^{1}$H NMR signal is recorded and using the relationship determined in the calibration procedure, this gives the amount of fluid within the pores of the cuttings 22 and thus their pore volume. The porosity of the cuttings is calculated from the measured pore and bulk volumes using the formula $$\text{porosity} = \frac{\text{pore volume}}{\text{bulk volume}} \times 100\%$$

The number of hydrogen atoms in unit volume of water is only approximately the same as in the same volume of oil. Consequently, determination of pore volume and hence porosity may be somewhat approximate when the fluid in the pores has a content of hydrogen atoms per unit volume which is not the same as in the aqueous brine used for calibration. Accuracy may be improved by determining the proportions of oil and water in the pores. If required, this may be done by an analytical procedure or from measurements of NMR relaxation times. These are one of the further $^{1}$H NMR measurements which also be made.

As is well known, information can be obtained using pulsed radio frequency signals and receiving echoes. Notably, transverse relaxation time $T_2$ of the liquid in the pores may be determined using the conventional Carr-Purcell-Meiboom-Gill (CPMG) procedure (see H. Y. Carr and E. M. Purcell "Effects of diffusion on free precession in nuclear magnetic resonance experiments" Physical Review, vol 94, pages 630-638 (1954) and S. Meiboom and D. Gill ("Modified spin-echo method for measuring nuclear relaxation times" Review of Scientific Instruments, vol 29, pages 688-691 1958)).

A. Timur "Pulse nuclear magnetic resonance studies of porosity, moveable fluid, and permeability of sandstones" J. Petrol. Technol. Vol 21 (1969) pages 775-786 gives methods for estimating permeability and volume of movable fluid using pulsed NMR techniques. Kenyon et al, "A three-part study of NMR longitudinal relaxation properties of water-saturated sandstones" SPE Formation Evaluation vol 3 (1988) pages 622-636 gives a method for estimating permeability from longitudinal relaxation time T1. Coates et al "A new characterization of bulk-volume irreducible using magnetic resonance", in The Log Analyst vol 39 (1998) pages 51-67 give a method for estimating irreducible water volume from pulsed NMR data. Although these procedures were disclosed in connection with laboratory examination of rock cores brought to the surface, they could also be applied to the examination of drill cuttings submerged (as disclosed here) in a bathing liquid with no hydrogen content.

The transverse $T_2$ (and also the longitudinal $T_1$) relaxation times are sensitive to confining geometry (pore size). When a single liquid is present in the pores, a distribution of $T_2$ relaxation times is considered equivalent to a pore size distribution. When both oil and aqueous phases are present in the pores, a $T_2$ distribution can be used to differentiate between these phases. This observation can then be used to improve the accuracy of pore volume determination.

The NMR spectrometer may be equipped to generate a pulsed field gradient and obtain a correlation of the $T_2$ distribution and the molecular self-diffusion coefficient D. This can provide a more sensitive differentiation between oil and aqueous phases in the pores (see W. S. Price (1998) "Pulsed-field gradient nuclear magnetic resonance as a tool for studying translational diffusion: Part II. Experimental aspects" in Concepts in Magnetic Resonance, 10, 197-237 and M. D. Hurlimann, L. Venkataramanan (2002) "Quantitative measurement of two-dimensional distribution functions of diffusion and relaxation grossly inhomogeneous fields" Journal of Magnetic Resonance, 157, 31-42). Properties such as irreducible water saturation and effective (producible) porosity may be obtained by integration under a $T_2$ or $D$-$T_2$ distribution.

The method as embodied above may be carried out when the drilling fluid is based on an aqueous brine but also when it is based on an oil phase.

Example 2

A variation on the embodiment above is shown by FIGS. 6, 7 and 8. The drilling fluid is an aqueous solution of caesium formate, used to give a drilling fluid density greater than 2 gram/litre. As shown in FIG. 6, the tube 8 contains a non-conducting mesh support 32. A quantity of FLUORINERT FC-40 indicated as 10 is placed in the tube 8. The submerged cuttings 22 rest on this. Dense drilling fluid 34 from the exterior of the drill cuttings 22 settles at the bottom of the tube 8 beneath the mesh 32. The tube 8 is placed inside the magnetic field and radio-frequency coil 16 of a bench top NMR spectrometer. The tube 8 and the NMR spectrometer are constructed so that drilling fluid 34 which collects beneath the mesh 32 is outside the radio-frequency coil 16 of the spectrometer and so does not provide $^1H$ resonance signals. Calibration, determination of bulk volume, determination of pore volume and other examination by $^1H$ NMR are carried out in exactly the same manner as for the embodiment of FIGS. 1 to 5. The difference is that the dense drilling fluid 34 displaced by the fluid 10 sinks to a position below the RF coil 16 instead of floating above it.

Example 3

FIGS. 9 and 10 show another embodiment of the method, in which $^{19}F$ NMR is again used to determine the bulk volume of the sample drill cuttings, but this is done in a different way. In this embodiment of the method, $^{19}F$ resonance is used to make an image of the bathing liquid before and after the sample cuttings are submerged in this bathing liquid.

A perfluorocarbon is again used as the bathing liquid. The NMR spectrometer is equipped with coils 38 which, when energised, superimpose a magnetic field gradient on the magnetic field of the permanent magnets 18. The gradient is oriented so that the magnetic field varies linearly along the vertical direction, parallel to the axis of the sample holder 8 and RF coil 16. The resonance frequency of any resonant nucleus then varies along the field gradient. By observing $^{19}F$ signal amplitude over the range of resonant frequency, the NMR spectrometer is able to obtain a plot of signal amplitude against vertical position. This plot is in effect an image of the bathing liquid along the vertical axis and the upper surface of the liquid as an abrupt change in signal amplitude.

Figure 9A:
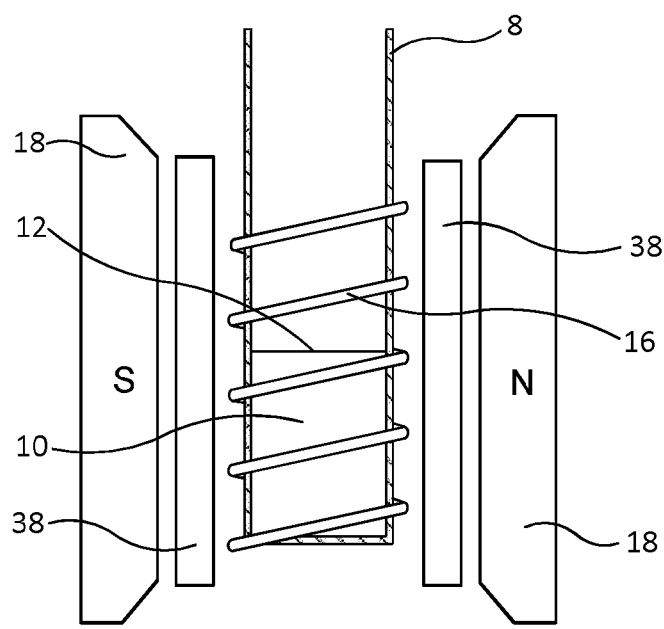
FIGS. 9a, 9b, 10a and 10b diagrammatically illustrate stages in an embodiment of the method using NMR imaging to determine bulk volume, and include plots of $^{19}F$ amplitude against vertical position.
Figure 9B:
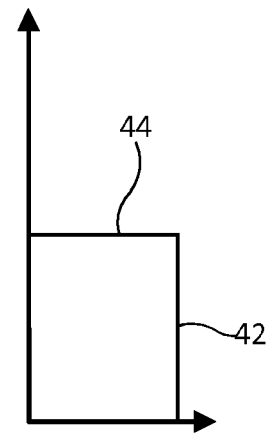

The first step in this embodiment of the method is that a quantity of the perfluorocarbon liquid, FLUORINERT FC-40, indicated by numeral 10 is placed in tube 8 as illustrated by FIG. 3 and the tube is placed in an NMR spectrometer with gradient coils 38 as shown by FIG. 9a. The amount of liquid 10 is such that its upper surface 12 is only part way up the coil 16. The spectrometer is operated to obtain a plot of signal amplitude against vertical position. This has the form shown in FIG. 9b in which signal amplitude is on the horizontal axis. As shown in FIG. 9b, the measured amplitude 42 drops to nothing at a sharp boundary 44.

Figure 10A:
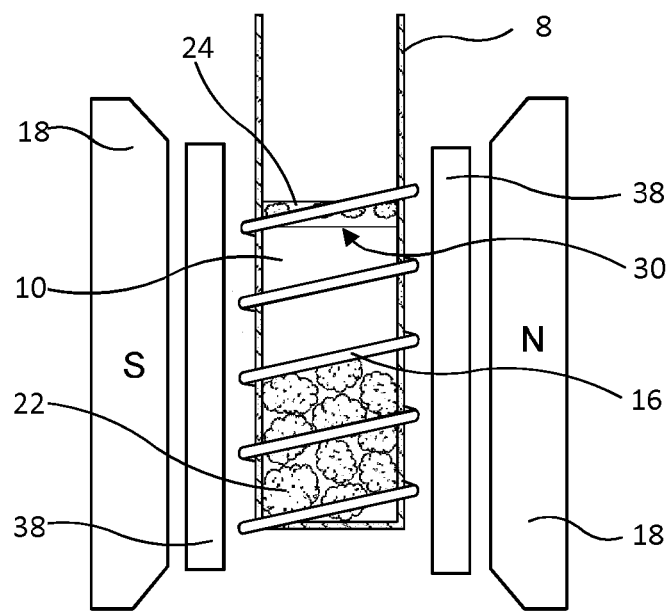
Figure 10B:
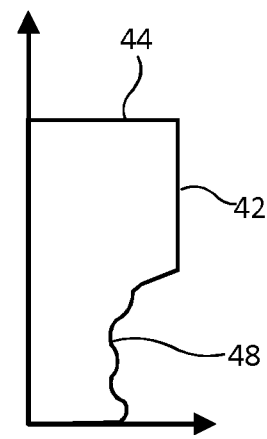

Next, the tube 8 is taken out of the spectrometer and a sample quantity of drill cuttings 22 is submerged in the FLUORINERT FC-40. As before, any drilling fluid 24 carried into the tube 8 on the exterior of the cuttings detaches and floats to the top in the same manner as shown in FIG. 4. The tube 8 is then returned the spectrometer, as shown by FIG. 10a. The size of the sample of cuttings 22 added to the tube 8 is chosen so that the cuttings 22 are within the coil 16 and the interface 30 between the bathing liquid 10 (FLUORINERT FC-40) and drilling fluid 24 is also within the coil 16. The spectrometer is again operated to obtain a plot of $^{19}F$ signal amplitude against vertical position. This has the form shown by FIG. 10b. For the region in which there are submerged cuttings 22, the signal amplitude varies, as schematically indicated at 48. Above this the amplitude 42 becomes steady and then drops to zero at a sharp edge 44 at the position of the interface 30. The volume of liquid 10 displaced by addition of the sample drill cuttings 22 is calculated from the cross-sectional area of tube 8 and the distance from the position of the surface 12 before sample addition to the position of the interface 30 between the bathing liquid 10 and drilling fluid 24 after sample addition.

After obtaining the volume of FC-40 displaced by drilling cuttings, the spectrometer is changed to carry out $^1H$ NMR. The field gradient coils 38 are energised and the spectrometer obtains a plot of $^1H$ signal amplitude against vertical position. Signal from the displaced drilling fluid 24 is discarded and the total amplitude of the $^1H$ NMR signal from below the interface 30 is proportional to the amount of liquid within the pores of the cuttings 22 and thus proportional to the pore volume. The ratio of 1H signal amplitude to liquid volume may be determined by a calibration procedure such as described with reference to FIGS. 1 and 2 using aqueous brine.

Observation of Two Resonant Frequencies

The embodiments of method described in Examples 1 to 3 above require provision of equipment able to observe both $^1H$ and $^{19}F$ magnetic resonance as required. The resonant frequencies of these elements are sufficiently far apart that they can be clearly distinguished even though the resonance will extend over some bandwidth. The resonant frequency of $^{19}F$ is about 94% of the resonant frequency of $^1H$ under the same magnetic field, as will be apparent from their respective magnetogyric ratios which are: $\gamma(^{19}F)=2.52\times10^8$ rad $s^{-1}T^{-1}$ and $\gamma(^1H)=2.67\times10^8$ rad $s^{-1}T^{-1}$.

Changing between $^1H$ and $^{19}F$ NMR can be done in several ways. One possibility would be to use two spectrometers, each able to receive the tube 8, with one spectrometer set up to carry out 1H NMR and the other to carry out 19F NMR. A somewhat similar possibility is to use a single spectrometer with exchangeable probes. An NMR probe is an assembly containing the RF coil and some associated electrical circuit components, in a casing which is transparent to the RF signals. $^1$H and $^{19}$F detection may then be achieved by swapping between two probes, one tuned to one resonant frequency and the other of them tuned to the other resonant frequency.

On NMR spectrometers with low magnetic field strength such as can be provided by permanent magnets, as appropriate for use at a well site, $^{19}$F detection may be achieved by manual retuning of a probe optimised for $^1$H, thus allowing a single probe to be used for both measurements. Alternatively, a mechanical or electronic switch could be included in the circuitry so as to allow rapid change of the resonance of the tuned circuit from $^1$H to $^{19}$F and vice versa. Another possibility is the use of a dual tuned resonant circuit that can transmit and detect at either frequency. A spectrometer capable of detecting two resonant nuclei is referred to as a dual resonance spectrometer and methods of detection and appropriate circuit designs are known.

Although the resonant frequencies of $^1$H and $^{19}$F are sufficiently far apart to be distinguishable despite the bandwidth around each resonance, it may be helpful to have filtering on the receiver to prevent signal contamination from off-resonant nuclei. Filtering may be achieved with analogue electronics, although in modern spectrometers the received signals are normally handled as digital signals and filtering is usually applied to the digital signal. A discussion of digital filtering can be found in J. Mitchell, L. F. Gladden, T. C. Chandrasekera and E. J. Fordham "Low-field permanent magnets for industrial process and quality control" Progress in nuclear magnetic resonance spectroscopy, vol 76, pp 1-60. (2014) see subsection 3.3 "Digital filtering" at pp 10-14.

An experiment was carried out to demonstrate that a dual resonance spectrometer with gradient coils 38 can determine the position of the interface between a fluid containing fluorine atoms and a fluorine-free fluid. Quantities of FLUORINERT FC-40, aqueous brine and hydrocarbon (decane) were placed in a sample tube which was then stoppered and shaken. The tube was allowed to stand and over about two minutes the contents separated so that FLUORINERT FC-40 was at the bottom with aqueous brine floating above it and the hydrocarbon floating on top of the brine. The spectrometer was operated at each resonance frequency to make an image (plot of resonant signal amplitude against vertical position) of the sample tube. With $^{19}$F NMR a strong signal was observed over the vertical distance occupied by FLUORINERT FC-40 and a sharp drop to zero signal at the interface with the brine. With $^1$H NMR there was no signal over the vertical distance occupied by FLUORINERT FC-40 and a sharp rise to positive signals over the distances occupied by the brine and hydrocarbon. This experiment was also carried out using a refined mineral oil (containing no more than 2% aromatic hydrocarbon) in place of decane. The results were the same.

These experiments demonstrated that that the solubilities of water and aliphatic hydrocarbon in FLUORINERT and vice versa were so low that no hydrogen resonance signal was observed from within the FLUORINERT and no fluorine signal was observed from the aqueous and hydrocarbon phases. This procedure could be used to check the suitability of a candidate bathing liquid. These experiments also demonstrated that signals from the resonant nuclei could be clearly distinguished and were defined clearly enough that the volume of the liquids could be calculated from the vertical heights of each and the cross section of the sample tube.

Example 4

An embodiment of the method which utilizes an immiscible, non-wetting bathing liquid but uses $^1$H as the only magnetic resonance will now be described with reference to FIGS. 11 to 13. The sample tube 8 has a uniform internal diameter which is known from its manufacturing specification or is determined in a preliminary calibration.

As a first step a known volume of bathing liquid 110 is placed in the tube 8 as shown in FIG. 11. The upper surface of this liquid is indicated at 112. This known volume might be measured by hand using a syringe of known volume, or delivered by a metering device constructed to deliver a fixed volume, or provided in a pre-packed container holding the required volume. This liquid is chosen so that it does not contain any hydrogen atoms, is immiscible with both water and oil and is denser than the drilling fluid. It is non-wetting towards the rock of the drill cuttings so that it does not displace liquid present in the pores of sample cuttings. This liquid may be a perfluorocarbon such as FLUORINERT FC-40 although $^{19}$F resonance is not used.

A sample quantity of drill cuttings 22 is placed in the tube 8 so as to be submerged in the liquid 110 and the tube is gently agitated. As shown by FIG. 12, (and as previously described referring to FIG. 4) the drilling fluid 24 from the surface of the cuttings 22 floats to the top of the liquid 110 along with some very small solid particles 28.

The tube is next placed within the magnetic field and radio-frequency (RF) coil 16 of an NMR spectrometer as diagrammatically shown by FIG. 13. This NMR spectrometer is equipped with gradient field coils 38 which, as in the preceding Example, enable a magnetic field gradient varying along the vertical axis to be superimposed on the magnetic field of the permanent magnets 18. However, this NMR spectrometer has two RF coils 116,117 located with coil 117 axially above coil 116. The volume of liquid 110 and the size of the sample quantity of cuttings 22 are such that the interface 130 between the liquid 110 and the drilling fluid 24 is within the upper RF coil 117 of the spectrometer.

The NMR spectrometer is first operated with the gradient field coils 38 energised and using only the upper RF coil 117 so as to obtain a plot of signal amplitude against vertical position which is an "image" of the contents of the part of tube 8 as shown in FIG. 13b. The cuttings 22 are ignored in this step because they are at the bottom of the tube 8, outside the upper RF coil 117. The position of the interface 130 can be detected as the transition at line 122 between zero $^1$H signal from liquid 110 to substantial $^1$H signal from the drilling fluid 24 floating on the liquid 110. The upper horizontal 124 in FIG. 13b corresponds to the upper surface of the drilling fluid 24.

Because the internal diameter of the tube 108 is known, the total volume below interface 130 can be calculated easily. The bulk volume of the drill cuttings can then be obtained by subtracting the predetermined volume of liquid 110 from the volume below the interface 130.

In a second step, the NMR spectrometer is operated with the gradient field coils 38 switched off and using only the lower RF coil 116. This provides a direct measurement of the total $^1$H signal amplitude from the liquids in the pores of the drill cuttings 22 while excluding the drilling fluid 24 floating above interface 130 from the measurement because it is outside the lower RF coil 116. As in embodiments mentioned earlier, the total amplitude of the $^1$H NMR signal from the region of tube 8 containing the drill cuttings 22 is proportional to the amount of liquid within the pores of the cuttings 22 and thus proportional to the pore volume. The ratio of $^1$H signal amplitude to liquid volume may be determined by a calibration procedure such as described with reference to FIGS. 1 and 2 using aqueous brine.

Example 5

FIGS. 14 to 17 show another embodiment which also uses one magnetic resonance only.

FIG. 14 shows the sample holder used. It has two parts. The lower part 140 is a tubular container with a flat base. It has a screw thread 141 at its top, enabling attachment of an upper part which is a screw cap 142 connected to a small bore tube 144 marked with graduations. When the upper and lower parts are connected together, a sealing washer 146 prevents leaks at the connection. Graduations (not shown) marked on tube 144 allow visual observation of volume present within the assembled sample holder.

A sample of drill cuttings 22, with some drilling fluid on their exterior is placed in the lower part 140 as shown by FIG. 15. The upper part is then fitted onto the lower part 140. A known volume of liquid 110 with the same properties as in the previous embodiment is poured in from the top of the tube 144. The volume of liquid 110 is chosen in relation to the size of the sample of cuttings such that this liquid 110 fills the lower part 140 and extends up to an upper surface within the graduated tube 144. As shown by FIG. 16, drilling fluid 24 from the exterior of the cuttings 22 is displaced and floats on the liquid 110. The position of the interface 130 between the liquid 110 and the drilling fluid 24 is read using the graduations marked on the tube 144. This gives a measurement of the total volume below the interface 130. The small bore of tube 144 improves accuracy in determining this volume by visual observation of the position of the interface 130. As with the previous embodiment, the bulk volume of the drill cuttings 22 in the lower part 140 of the sample holder can be obtained by subtracting the known volume of liquid 110 from the measured volume below the interface 130.

Next, as shown by FIG. 17, the sample holder is placed in an NMR spectrometer, so that the lower part 140 fits within the RF coil 16 while the cap 142 and the tube 144 are above the coil. The spectrometer is operated to measure the amplitude of $^1$H magnetic resonance. As with previous embodiments this gives a measurement of the volume of liquid in the pores of the drill cuttings 22.

The embodiments of the general method exemplified by Examples 1 to 5 above can be carried out using a bench top spectrometer and simple apparatus for sample handling. It is envisaged that they can be carried out at a mud-logging facility at a well site to give results in something approaching real time.

A possibility is to introduce some automation of the process, using automated machinery including a robot arm to dispense bathing liquid into sample tubes, collect samples of suitable size, add these to bathing liquid in sample tubes and move the sample tubes into and out of the RF probe of an NMR spectrometer. This would provide a fairly continuous log of porosity of the cuttings and any other NMR properties determined. If a large number of test is carried out, so that automation is appropriate, it may be desirable to recover and recycle the FLUORINERT liquid.

It is possible that the method could be extended to examine NMR properties of an additional element with a resonant nucleus present in the liquid in the pores. For instance, if the drilling fluid is water based and contains a known concentration of sodium ions, measurement of the amplitudes of both $^{23}$Na and $^1$H resonances while sample cuttings are submerged in bathing liquid would show the extent to which liquid originally in the pores had been displaced by the drilling fluid. If the drilling fluid was water based and densified with caesium formate, the extent of invasion of pores by this drilling fluid could be determined by measurement of the amplitudes of both $^{133}$Cs and $^1$H resonances while sample cuttings are submerged in bathing liquid.

Example 6

This example contemplates examination of porous, hydrophilic particles to be used in chromatography. The particles are inorganic and have some hydrogen in their solid content. They are not wetted by carbon tetrachloride. Particles for examination are initially submerged in sodium chloride solution of known concentration and allowed to stand so that this solution fills the pores of the particles. A procedure as illustrated by FIGS. 11 to 13 is then carried out, using carbon tetrachloride as the immiscible, non-wetting bathing liquid and using $^{23}$Na NMR to detect the position of the interface between carbon tetrachloride and displaced sodium chloride solution floating on top of it, and also using $^{23}$Na resonance to determine the volume of sodium chloride solution in the pores of the particles.

Example 7

Figure 18:
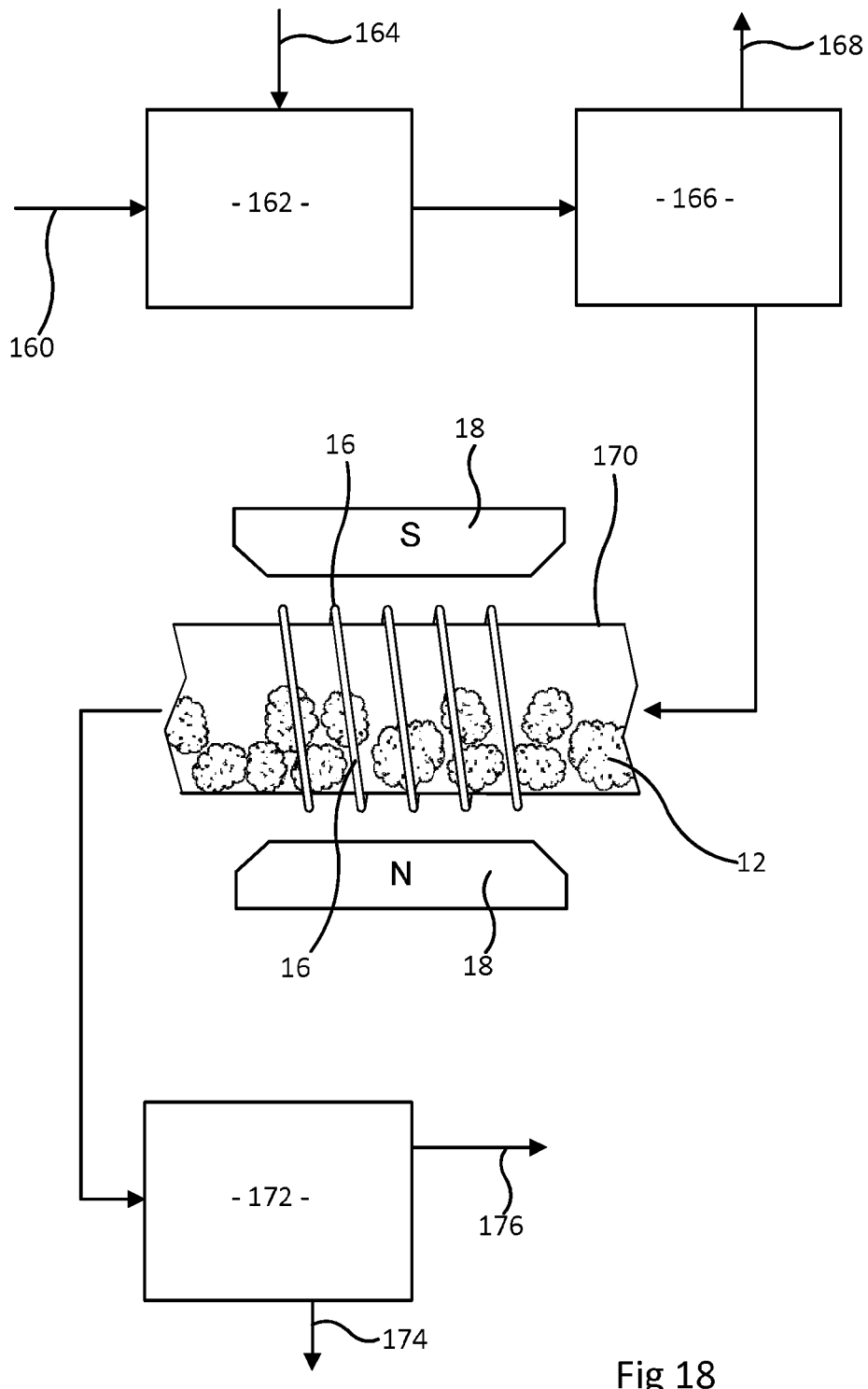

This example examines drill cuttings in a continuous process illustrated by FIG. 18. Drill cuttings mixed with some drilling fluid are collected from the drilling fluid as it returns to the surface and are supplied at 160 to a mixer 162 which is also supplied with a continuous flow of FLUORINERT FC-40 as bathing liquid entering the mixer at 164. The resulting mixture of drill cuttings, drilling fluid and FC-40 flows to a separator 166. Separated drilling fluid leaves the separator by outlet 168. The drill cuttings 12 entrained in FLUORINERT FC-40 flow into a tube 170 which extends through the magnetic field and RF coil 16 of an NMR spectrometer designed to observe continuously flowing material. This tube 170 may be made of glass or a ceramic material so that it does not contain any significant amount of the elements hydrogen and fluorine. After passing through the spectrometer, the FLUORINERT FC-40 and entrained drill cuttings go to a liquid-solid separator 172. The solid drill cuttings are discharged at 174 and the separated FLUORINERT FC-40 leaves at 176 and is recycled. It is possible that some FLUORINERT FC-40 leaves with drilling fluid at 168 and is separated from drilling fluid in a further separator, not shown, and recycled.

The NMR spectrometer repeatedly measures the amplitudes of $^{19}$F resonance and $^1$H resonance. The measurements may be made alternately rather than simultaneously, but are made sufficiently rapidly that there is negligible travel of FC-40 and cuttings 12 along the tube 170 during the time in which a measurement of $^1$H resonance amplitude and a measurement of $^{19}$F resonance amplitude are made. Consequently the cuttings which are inside the RF coil (and so within the RF and magnetic fields of the spectrometer) during the time for this pair of measurements provide one sample.

Another possibility would be to pump the FC-40 and entrained cutting along the tube with a stop-start motion, i.e.

pumping the flow forward and then stopping the flow alternately by control of a pump, and measuring both $^{19}$F resonance and $^{1}$H resonance while flow is stopped so that cuttings inside the coil while flow is stopped constitute a single sample.

Determination of bulk volume, pore volume and porosity from a pair of measurements of $^{19}$F and $^{1}$H signal amplitudes is analogous to the procedure described in Example 1 with reference to FIGS. 1 to 5. The proportionality between $^{19}$F resonance amplitude and volume displaced can be established in an initial calibration by placing FLUORINERT FC-40 and solid objects of known volume in the tube 170. The proportionality between pore volume and $^{1}$H resonance amplitude can be determined by a similar calibration using aqueous brine in the tube 170 with solid objects of known volume to reduce the volume of brine in the tube 170.

An alternative to making measurements of $^{19}$F and $^{1}$H signal amplitudes while the same sample quantity of FC-40 and entrained particles was within the RF field would be to carry out measurements of the signal amplitudes repeatedly, average the measurements and calculate average values of pore volume, bulk volume and porosity.

As mentioned in connection with Example 1, additional information may also be obtained by using $^{1}$H pulsed NMR methods as well as measurements of resonance signal amplitudes, all within a short time in which travel of FC-40 and cuttings 12 along the tube 170 is negligible.

In the Examples above, the porous material which is examined is in particulate form. However, the method could also be employed for examination of a single, larger piece of porous material. More specifically, it could be employed for examination of a rock core which has being cut in the borehole and brought to the surface. Although a rock core is cut as a cylinder, it is possible that the cylinder will have surface cavities where fragments of rock have broken away. Such irregularities in shape introduce error if bulk volume is calculated from dimensions of the cylinder but not if bulk volume is measured in the course of the method disclosed above. The procedure employed may be the same as in Example 1 above except for using a rock core which is a single piece of material in place of a quantity of drill cuttings.

Modifications to the embodiments illustrated and described above are possible, and features shown in the drawings may be used separately or in any combination. Notably, it is possible that an arrangement with two rf coils as in FIGS. 11 to 13 could be used with other embodiments, such as in the spectrometer shown in FIGS. 9 and 10. Non wetting liquids may not always be perfluorocarbons.

The invention claimed is:

1. A method of using nuclear magnetic resonance (NMR) to examine a porous material, the pores of which contain liquid in which there is an element with a resonant nucleus, wherein the method comprises:
   submerging the material in a bathing liquid which
      is immiscible with the liquid in the pores,
      is non-wetting towards the material in the presence of the liquid which is in the pores,
      differs in density from any liquid on an outside of the material,
      is immiscible with any liquid on the outside of the material, and
      does not contain the element with the resonant nucleus; and
   operating an NMR spectrometer to:
      observe signals from nuclei of the element with the resonant nucleus while the material remains submerged in the bathing liquid; and
      obtain a measurement of signal amplitude correlated with vertical position, and thereby detect a position of an upper surface of the bathing liquid with the sample submerged therein, and thereby measure total volume of the bathing liquid and submerged porous material.

2. The method according to claim 1, wherein a magnetic field of the NMR spectrometer is provided by permanent magnets.

3. The method according to claim 1, wherein the bathing liquid is a compound or mixture of compounds which comply with a general formula $$C_a F_b X_c$$

where X denotes an atom other than carbon or fluorine which is covalently attached to at least one carbon atom, where a is at least 6, and b is at least 6 times c.

4. The method according to claim 3, wherein a is at least 8, c is 0 or 1, and X is nitrogen when c is 1.

5. The method according to claim 1, comprising determining a bulk volume of the porous material when the porous material is submerged in the bathing liquid.

6. The method according to claim 5, wherein a sample of the porous material is submerged in the bathing liquid in a vessel marked with volume graduations.

7. The method according to claim 5, wherein the NMR spectrometer comprises coils to create a magnetic field gradient in which field strength varies with vertical position.

8. The method according to claim 5, comprising:
   operating an NMR spectrometer to obtain a measurement of change in amplitude of resonance of a second resonant element when the porous material is submerged in the bathing liquid, the second resonant element being present in the bathing liquid but not in the porous material.

9. The method according to claim 1, wherein the measurement of signal amplitude correlated with vertical position is a measurement of an amplitude of resonance of a second resonant element present in the bathing liquid but absent from the sample.

10. The method according to claim 1, the material including drill cuttings, and the method further comprising:
   collecting the drill cuttings from a borehole drilling operation.

11. A method of using nuclear magnetic resonance (NMR) to examine properties of a porous material with liquid which contains a first element with a resonant nucleus present in the pores, the method comprising:
   submerging the material in a bathing liquid which
      is immiscible with the liquid in the pores and is non-wetting to the material in the presence of the liquid in the pores so that the bathing liquid does not enter the pores of the material,
      differs in density from and is immiscible with any liquid containing the first element on an outside of the material, and
      does not itself contain the first element but does contain a second element with a resonant nucleus;
   operating an NMR spectrometer to observe resonance signals from nuclei of the first element present in the liquid in the pores but absent from the bathing liquid and thereby determine at least one magnetic resonance property of the liquid in the pores;

operating the same or another NMR spectrometer to measure change in resonance signal from nuclei of the second element in the bathing liquid when the material is submerged in the bathing liquid, indicative of a volume of the bathing liquid displaced by the porous material submerged within it; and using the measurement indicative of the volume displaced by the submerged material and the at least one magnetic resonance property of the liquid in the pores to determine a porosity of the material.

12. The method according to claim 11, wherein the bathing liquid is a compound or mixture of compounds which comply with a general formula $$C_a F_b X_c$$

where X denotes an atom other than carbon or fluorine which is covalently attached to at least one carbon atom, where a is at least 6, and b is at least 6 times c.

13. The method according to claim 11, wherein the at least one magnetic resonance property of the liquid in the pores is the amplitude of magnetic resonance of the first resonant element in the liquid in the pores, indicating pore volume.

14. The method according to claim 11, wherein the bathing liquid is one or more fluorocarbons, and wherein measuring change in resonance signal from nuclei of the second element in the bathing liquid when the material is submerged in the bathing liquid comprises measuring change in amplitude of signal from $^{19}F$.

15. The method according to claim 11, wherein the NMR spectrometer comprises coils to create a magnetic field gradient in which field strength varies with vertical position, and wherein measuring change in resonance signal from nuclei of the second element in the bathing liquid when a sample of porous material is submerged in the bathing liquid comprises measuring change in position of an upper termination of signal from $^{19}F$.

16. The method according to claim 11, wherein operating the NMR spectrometer to observe signals from resonant nuclei of the first element present in the liquid in the pores further comprises application of pulsed NMR signals and observation of echo signals.

17. The method according to claim 16, comprising determining transverse relaxation times.

18. The method according to claim 11 applied to discrete samples of the porous material.

19. The method according to claim 11, comprising:
flowing a stream of bathing liquid with porous material entrained therein along a flow path through the NMR spectrometer; and
repeatedly operating the NMR spectrometer to observe signals from a portion of the stream which is currently within the NMR spectrometer.

20. The method according to claim 11, the material including drill cuttings, and the method further comprising:
collecting the drill cuttings from a borehole drilling operation.

* * * * *